United States Patent
Domanski

(10) Patent No.: US 9,058,991 B2
(45) Date of Patent: Jun. 16, 2015

(54) DIODE STRING

(75) Inventor: Krzysztof Domanski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/535,495

(22) Filed: Jun. 28, 2012

(65) Prior Publication Data

US 2014/0001600 A1 Jan. 2, 2014

(51) Int. Cl.
*H02H 3/22* (2006.01)
*H01L 29/74* (2006.01)
*H01L 27/02* (2006.01)

(52) U.S. Cl.
CPC .................... *H01L 27/0255* (2013.01)

(58) Field of Classification Search
CPC ............. H02H 3/22; H02H 9/04; H01L 29/74
USPC ......... 257/546, 173, 107, 355, 357, 162, 146, 257/141, 111, 109, E29.181, 918, 362, 119, 257/658, E25.002, E21.358, 925, 310, 257/E27.051, E29.013; 438/133; 361/56, 361/91.1, 111, 91, 118
See application file for complete search history.

(56) References Cited

U.S. PATENT DOCUMENTS

| 5,530,612 | A * | 6/1996 | Maloney ........................ 361/56 |
| 6,501,632 | B1 * | 12/2002 | Avery et al. .................. 361/111 |
| 6,963,112 | B2 | 11/2005 | Chen et al. |
| 7,372,109 | B2 | 5/2008 | Chen et al. |
| 7,405,445 | B2 | 7/2008 | Huang et al. |
| 7,525,779 | B2 | 4/2009 | Chen et al. |
| 2003/0016479 | A1 * | 1/2003 | Song .............................. 361/56 |
| 2005/0045909 | A1 * | 3/2005 | Zhang .......................... 257/173 |
| 2005/0073006 | A1 * | 4/2005 | Pequignot et al. ............ 257/355 |
| 2009/0262474 | A1 * | 10/2009 | Farzan et al. ................. 361/56 |
| 2010/0214705 | A1 * | 8/2010 | Kim et al. ..................... 361/56 |
| 2011/0032647 | A1 * | 2/2011 | Kawachi ........................ 361/56 |

* cited by examiner

*Primary Examiner* — David Vu
*Assistant Examiner* — Mouloucoulaye Inoussa
(74) *Attorney, Agent, or Firm* — Eschweiler & Associates, LLC

(57) ABSTRACT

Devices and methods are provided, wherein a diode string is provided in a well and the well is biased with an intermediate voltage between voltages applied to terminals of the diode string.

10 Claims, 3 Drawing Sheets

DIODE STRING

FIELD

The present application relates to diode strings, i.e. two or more diodes coupled in series with each other, and corresponding methods.

BACKGROUND

Diode strings are for example used for ESD (Electrostatic Discharge) protection of integrated circuits. In particular, via such a diode string an ESD pulse may be shunted to a supply voltage like VDD or VSS. In some cases, diodes of such diode strings are formed using well structures. However, in some circumstances like overvoltage at a pad to be protected, i.e. a voltage outside a normal range, but below typical ESD voltages, and/or turned off supply voltages, parasitic bipolar transistors formed by the above mentioned well structures may become conducting leading to undesired leakage currents.

DETAILED DESCRIPTION

Figure 1:
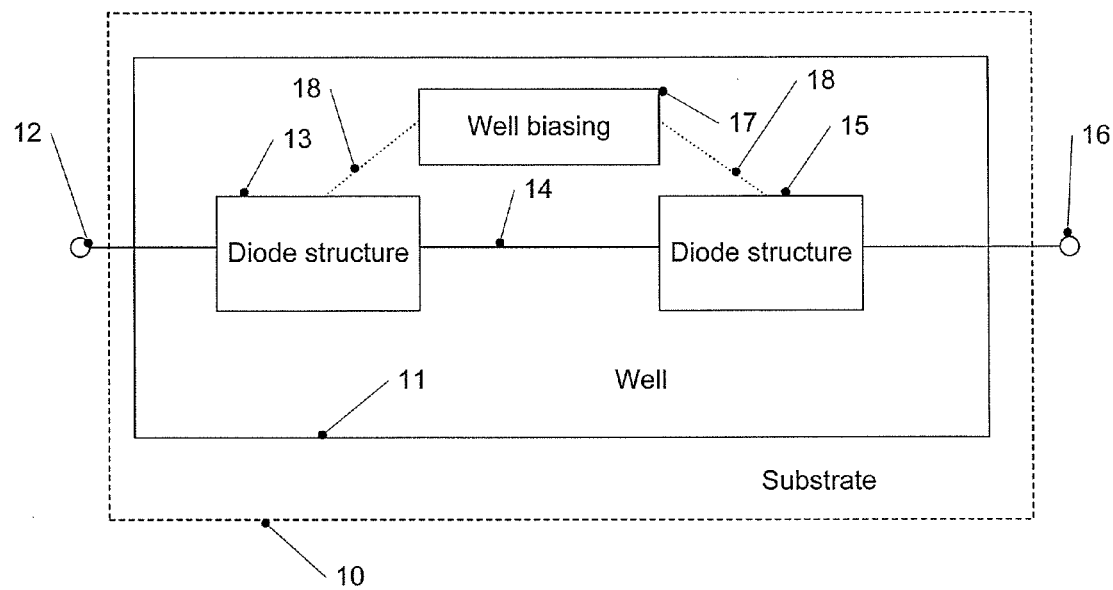
FIG. 1 shows a schematic diagram of a diode string according to an embodiment.

In the following, embodiments of the present invention will be described in detail with reference to the attached drawings. It should be noted that the embodiments merely serve for illustrating some possibilities to implement the invention and are not to be construed as limiting the scope of the present application in any way.

Features of different embodiments may be combined with each other unless specifically noted otherwise. On the other hand, describing an embodiment with a plurality of features is not to be construed as indicating that all such features are necessary for practicing the present invention, as other embodiments may comprise less features and/or alternative features to the ones shown.

Moreover, it is to be noted that any direct connection or coupling between two elements shown in the drawings or described herein, i.e. any connection or coupling without any intervening elements, may also be implemented by an indirect connection, i.e. a connection or coupling comprising one or more intervening elements, as long as the intended function of the respective connection or coupling is preserved, for example a function of applying a voltage to an element or the function of transmitting a signal from element to another element.

Furthermore, in some cases embodiments are described as comprising several functional blocks or elements. It should be noted that in such cases the functional blocks or elements need not necessarily be implemented by different structures or circuits, but in some embodiments also two or more of such functional blocks or elements may be implemented by a common structure or by a common circuit.

In the following, for some embodiments semiconductor structures will be described, wherein parts of the structure are referred to as having a polarity. A polarity of a semiconductor is to be understood as either being an n-polarity caused by an n-doping or a p-polarity caused by a p-doping. For example, in case of silicon semiconductor structures n-doping may be achieved by adding phosphorus or arsenic, and p-doping may for example be achieved by adding boron. For other semiconductors, e.g. III-V semiconductors like gallium arsenide, other appropriate dopants may be used.

Within a polarity, different degrees of doping, i.e. different dopant concentrations are possible. Highly doped regions, in particular degenerately doped regions, may serve to provide electrical contacts.

Turning now to the Figures, in FIG. 1 a schematic diagram of a diode string according to an embodiment is shown. The diode string of FIG. 1 comprises a first diode structure 13 and a second diode structure 15 coupled in series between a first terminal 12 and a second terminal 16. In some embodiments, first terminal 12 may be an input/output (I/O) terminal to be protected against electrostatic discharge (ESD), and second terminal 16 may be a supply voltage terminal, for example for VSS or VDD, or vice versa.

For example, a first terminal (for example a cathode) of diode structure 13 may be coupled with terminal 12, a second terminal (for example an anode) of diode structure 13 may be coupled with a first terminal (for example a cathode) of diode structure 15 via a coupling 14, and a second terminal of diode structure 15 (for example an anode) may be coupled with terminal 16.

First diode structure 13 and second diode structure 15 in the embodiment of FIG. 1 are arranged in a semiconductor well 11 of a first polarity, which in turn is arranged in a substrate 10 or other semiconductor material (like a further well) of a second polarity different from the first polarity. For example, well 11 may be an n-well, and substrate 10 may be a p-doped substrate.

First diode structure 13 and second diode structure 15 in some cases each may comprise a further well of the second polarity arranged within well 11 to provide electrical insulation between the diode structures. For example, in this way the first diode structure 13 and the second diode structure 15 together with well 11 each may implement a triple well diode.

In some embodiments, well 11 may comprise a single continuous semiconductor region of the first polarity. In other embodiments, well 11 may be split e.g. to comprise two semiconductor regions of the first polarity, one for each diode structure 13, 15. In this case, an ohmic electrical connection, e.g. a metal connection or a highly doped polysilicon connection of the first polarity, electrically coupling the two semiconductor regions such that they electrically have basically the same effect as a single continuous semiconductor region is provided. A resistance of such an ohmic electrical connection may e.g. be below 10 Ohm, or below 5 Ohm.

The embodiment of FIG. 1 further comprises well biasing circuitry 17 for biasing well 11, i.e. for applying a voltage to well 11. As indicated by dotted lines 18, well biasing circuitry 17 in some embodiments applies a voltage to well 11 depending on voltages present at first diode structure 13 and second diode structure 15, in particular voltages corresponding to or derived from voltages applied to terminals 12 and 16, but not based on any additional voltages like an additional supply voltage. In some embodiments, the thus applied voltage is an intermediate voltage between voltages applied to terminals 12 and 16 and/or corresponding to a voltage on coupling 14, i.e. a voltage corresponding to a voltage at the second terminal of diode structure 13 and first terminal of diode structure 15 or, taking for example a resistance of coupling 14 into account, a voltage between the second terminal of diode structure 13 and the first terminal of second diode structure 15 (i.e. the terminals linked by coupling 14). In other embodiments, the voltage applied to well 11 may be derived from the voltages applied to terminals 12 and 16 in a different manner, for example by using some divider structure. In some embodiments where a first voltage is applied to terminal 16 and a second voltage lower than the first voltage is applied to terminal 12, the voltage applied to well 11 may be one diode threshold below the first voltage or higher.

In some embodiments, the voltage is applied such that parasitic bipolar transistors do not become conducting in case the supply voltage at terminal 12 or terminal 16 is turned off and/or a voltage outside a regular voltage range (overvoltage or undervoltage) by at most a predetermined voltage difference is applied to terminal 12 and/or terminal 16. In some embodiments, well 11 is biased such that an undervoltage tolerance of two diode thresholds is provided.

Figure 2:
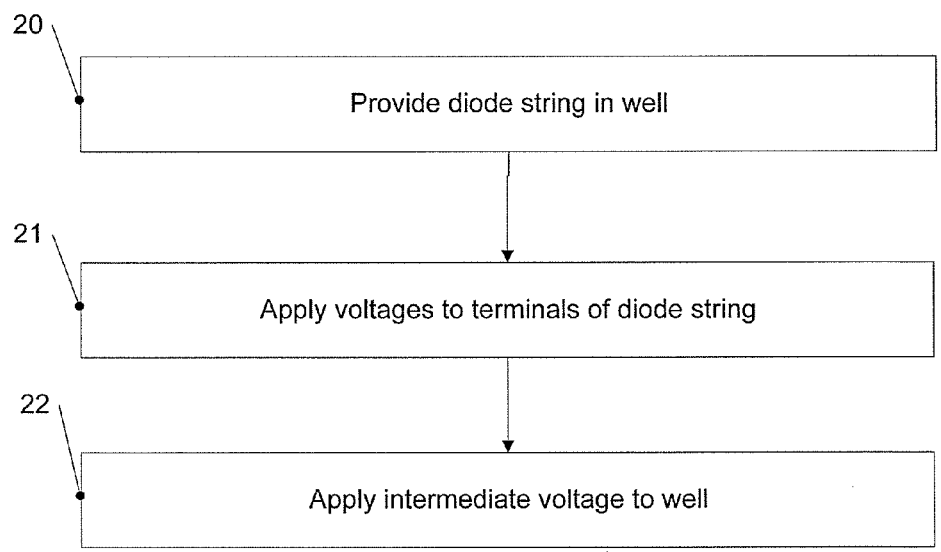
FIG. 2 shows a flowchart illustrating a method according to an embodiment.

In FIG. 2, a flowchart illustrating a method according to an embodiment is shown. The method may be implemented using the diode string of the embodiment of FIG. 1 or any of the diode strings which will be explained below, but also may be implemented independently therefrom.

At 20, a diode string is provided in a semiconductor well having a first polarity different from a second polarity of a substrate in which the well is embedded. The diodes of the diode string may for example be formed in individual wells of the second polarity thus forming triple well diodes.

At 21, voltages are applied to terminals of the diode string. At 22, an intermediated voltage between the voltages applied to the diode string is applied to the well, wherein the intermediate voltage may be derived from the voltages applied to the terminal of the diode string without using any additional supply voltages.

The intermediate voltage may prevent parasitic bipolar transistors in the structure from becoming conducting in certain circumstances, for example when a supply voltage is turned off or when a voltage applied to a terminal of the diode string exceeds a regular voltage range by at most a predetermined voltage difference.

Figure 3:
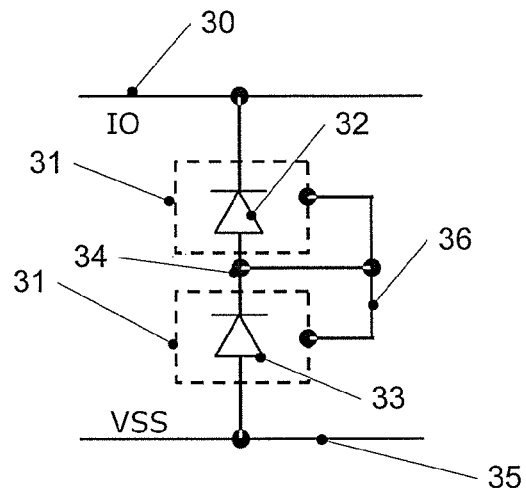
FIG. 3 is a circuit diagram illustrating a diode string according to an embodiment.

In FIG. 3, a schematic circuit diagram of a diode string according to an embodiment is shown. In the embodiment of FIG. 3, a diode string comprises a first diode 32 and a second diode 33. First diode 32 and second diode 33 are provided in a well 31 embedded within a substrate. The polarity of well 31 in an embodiment is different from the polarity of the substrate. First diode 32 and second diode 33 in some embodiments may be provided in separate wells formed within well 31 and having a polarity different from well 31.

A cathode of first diode 32 is coupled with a terminal 30, for example an input/output (I/O) terminal. An anode of first diode 32 is coupled with a cathode of second diode 33. An anode of second diode 33 is coupled with a terminal 35, for example a supply voltage VSS.

An intermediate node 34 between the anode of first diode 32 and the cathode of second diode 33 is coupled with well 31 via a coupling 36, for example a connection made of metal layers, metal wires or highly-doped silicone. Coupling 36 is an example for biasing circuitry applying a bias voltage to well 31. Coupling 36 in some embodiments may have a resistance smaller than 10Ω. Through coupling 36, the well is biased with an intermediate voltage between the voltages at terminals 30 and 33, without using an additional supply voltage like VDD. In this way, in some embodiments a parasitic bipolar transistor may be prevented from becoming conducting in certain circumstances, for example if VSS fails or if a voltage applied to input/output terminal 30 exceeds a "usual" range, for example between 0 and 5 V, by at most a predetermined threshold, for example at most 2 Volts (e.g. between −2 and 7 V in this example).

Figure 4A:
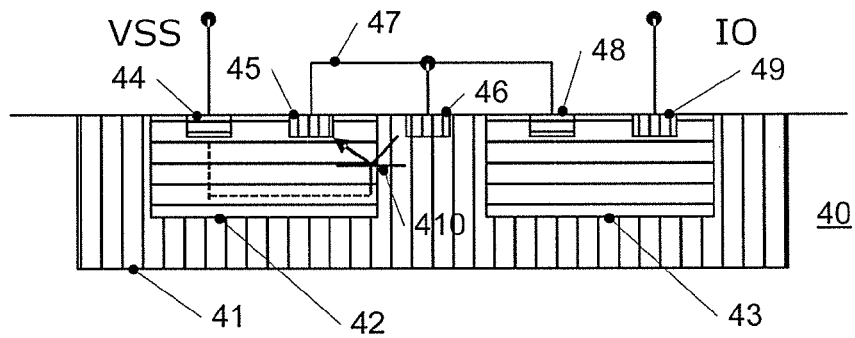
FIG. 4A is a schematic cross-sectional view of a semiconductor structure illustrating a diode string according to an embodiment.

In FIG. 4A, a semiconductor structure implementing a diode string according to an embodiment is shown. The embodiment of FIG. 4A is one possible structural realization of the embodiment of FIG. 3. However, it is to be noted that structural realizations of the embodiment of FIG. 3 are not limited to the structure shown in FIG. 4A.

The structure of FIG. 4A comprises a well 41 of a first polarity, for example an n-well, embedded within a substrate 40 of a second polarity, for example a p-type substrate. For forming a first diode, a p-well 43 serving as an anode is provided within a well 41. Within p-well 43, a highly-doped n-well 49 (sometimes also simply referred to as n+ region) serving as cathode and a highly doped p-well 48 (sometimes also simply referred to as p+ region) serving as anode contact of the first diode are formed. Highly-doped n-well 49 is coupled to a terminal, for example an input/output terminal.

To form a second diode, a p-well 43 is formed within n-well 41 as an anode. To contact the anode of the second diode, a highly-doped p-well 44 (sometimes also simply referred to as p+ region) is provided as anode contact. For forming the cathode a highly-doped n-well 45 (sometimes also simply referred to as n+ region) is provided. The highly-doped p-well 44 serving as anode contact may be coupled with a terminal, for example a supply voltage VSS. In other words, the p-n-junction of the first diode is formed between p-well 43 and highly-doped n-well 49, whereas the p-n-junction of the second diode is formed between p-well 42 and highly-doped n-well 49.

Furthermore, for contacting n-well 41 a highly-doped n-well or n-contact 46 is provided. Moreover, via a coupling 47 highly-doped n-well 45 serving as cathode of the second diode is connected with highly-doped n-well 46 for contacting n-well 41 and with highly-doped p-well 48 serving as anode contact of the first diode. Therefore, via coupling 47 and highly-doped n-well 46 serving as well contact n-well 41 is biased with an intermediate voltage between the voltage present at highly-doped p-well 44 serving as anode contact of the second diode and a voltage present at highly-doped n-well 49 serving as cathode of the first diode.

A parasitic bipolar npn transistor 410 may for example be formed by highly-doped n-well 45 as emitter, p-well 42 as base and n-well 41 as collector as indicated in FIG. 4A. By biasing n-well 41 as explained above, this parasitic npn transistor 410 is for example prevented from becoming conducting when VSS fails. A similar parasitic npn transistor is formed at the first diode with p-well 43 serving as base. Such an npn transistor may be prevented from becoming conducting in case of an overvoltage or undervoltage at the I/O-terminal, i.e. at n-well 49.

In the embodiment shown, by the well biasing explained above a voltage of the well may be kept at least two diode thresholds above substrate 40.

In the embodiment of FIG. 4A, well 41 is provided as a continuous well, e.g. a continuous n-doped semiconductor region. In other embodiments, a corresponding well may be provided as a split well comprising two or more separate n-wells with an ohmic connection between them. A corresponding embodiment is shown in FIG. 4B.

Figure 4B:
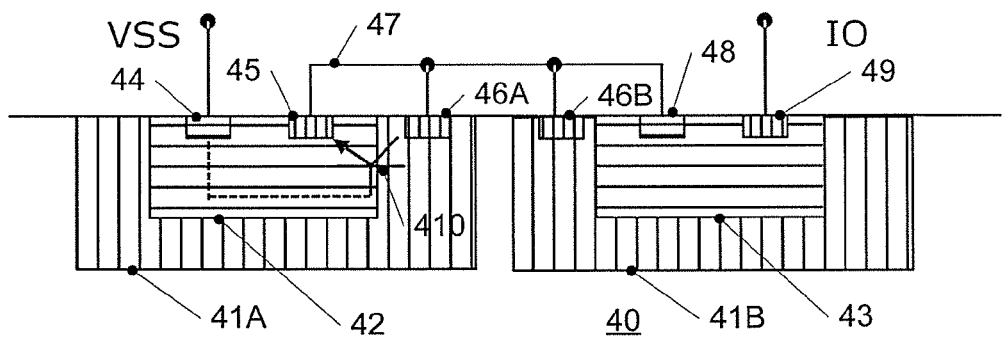
FIG. 4B is a schematic cross-sectional view of a semiconductor structure illustrating a diode string according to an embodiment.

The embodiment of FIG. 4B is a variation of the embodiment of FIG. 4A, and corresponding elements bear the same reference numeral and will not be described again. Instead of n-well 41 of FIG. 4A, a first n-well 41A for the first diode and a second n-well 41B for the second diode is provided. First n-well 41A has a highly-doped n-well 46A for contacting n-well 41A, and second n-well 41B has a highly-doped n-well 46B for contacting n-well 41B. Highly-doped n-wells 46A, 46B are coupled with coupling 47 which therefore provides an ohmic electrical connection between first and second n-wells 41A, 41B and biasing both first and second n-wells 41A, 41B at the intermediate voltage.

Therefore, the electrical situation in FIG. 4B in particular as regards parasitic bipolar npn transistor 410 is basically the same as in FIG. 4A.

It should be noted that while in FIG. 4B coupling 47 serves both for biasing the first and second n-wells 41A, 41B and for providing an ohmic electrical connection between first and second n-wells 41A, 41B, in other embodiments on coupling may be provided for biasing and a further coupling may be provided to form the ohmic electrical connection.

In the embodiments of FIGS. 1, 3, 4A and 4B a diode string formed by two diodes is coupled between two terminals, for example a supply voltage like VSS and an input/output (I/O) terminal, for example for ESD protection of I/O terminal. However, the number of diodes is not particularly limited, and more diodes may also be coupled between the terminals.

Figure 5:
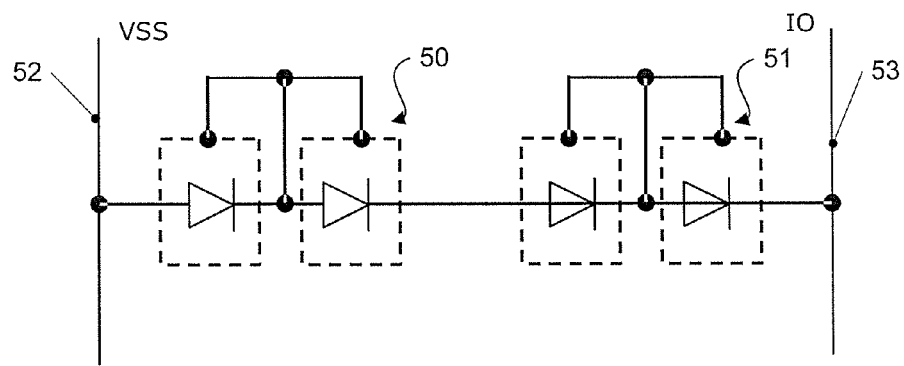
FIG. 5 is a circuit diagram illustrating a diode string according to an embodiment.

For example, in FIG. 5 an embodiment is shown where altogether four diodes form a diode string coupled between the first terminal 52, which for example is coupled to a supply voltage like VSS, and a second terminal 53, for example an input/output terminal, for example for ESD protection of the input/output terminal. In the embodiments of FIG. 5, four diodes are arranged in a first group 50 of two diodes and a second group 51 of two diodes, each of the two groups 50, 51 being implemented as shown in FIG. 3, i.e. a well in which the two diodes of each group are arranged is coupled with an intermediate node between the two diodes as shown in FIG. 5 and as explained in detail with respect to FIG. 3. Therefore, the structure of the groups 50, 51 will not be explained again in detail.

Figure 6:
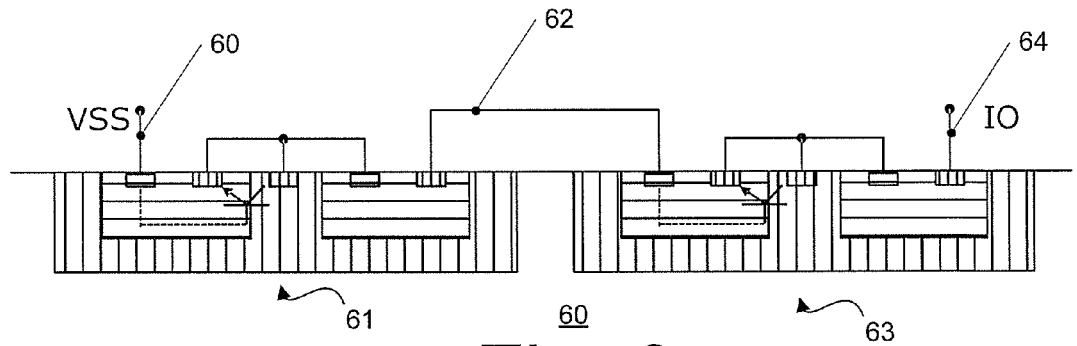
FIG. 6 is a cross-sectional view of a semiconductor structure implementing a diode string according to an embodiment.

In FIG. 6, a semiconductor structure according to an embodiment representing one possible implementation of the circuit of FIG. 5 is shown. In the embodiment of FIG. 6, two structures 61, 63 each being implemented as the two-diode structure of FIG. 4A, i.e. as an n-well with two diodes embedded therein, are provided in a substrate 30. As each of the structures 61, 63 are implemented as already explained with respect to FIG. 4A, this description will not be repeated again. Structure 61 is coupled with a first terminal 60, for example VSS, and second structure 63 is coupled with a second terminal 64, for example an input/output terminal. First structure 61 and second structure 63 are coupled in series via a coupling 62 as shown in FIG. 6. Coupling 62 may for example be implemented as a metal layer, a metal wire or a highly-doped polysilicon connection.

As already mentioned, the semiconductor structures shown in FIGS. 4A, 4B and 6 serve only as examples and other implementations are also possible. For example, in some embodiments the polarities may be reverse. In such an implementation, for example in FIGS. 4A and 4B, wells 41, 45 and 49 may be p-doped, and wells 42, 44, 43 and 48 may be n-doped. In such a case, substrate 40 may also be an n-type substrate. In still other embodiments, the diodes may be implemented as stacked diodes.

Figure 7:
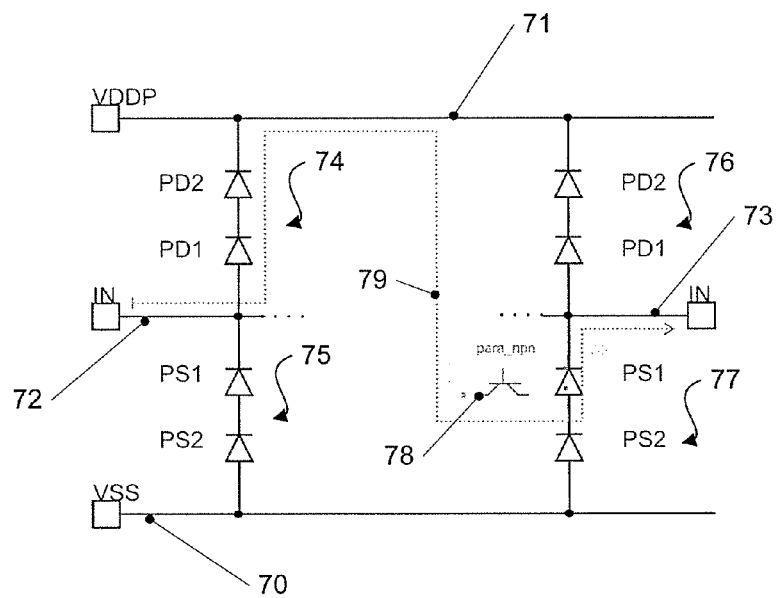
FIG. 7 shows an example environment using diode strings according to embodiments.

In FIG. 7, an environment where diode strings according to embodiments may be used is shown. In the example of FIG. 7, two input terminals 72, 73 of a circuit, for example an integrated circuit, are shown. As indicated by dots, input terminals 72, 73 are connected with core circuitry (not shown) to supply signals and/or voltages to the core circuitry or to output signals and/or voltages from the core circuitry.

As supply voltages, a supply voltage rail 70 connected to a first supply voltage, for example VSS, and a supply voltage rail 71 connected to a second supply voltage, for example VDDP, are provided.

A first diode string 74 comprising two diodes PD1, PD2 in the example shown couples input terminals 72 with voltage rail 71, a second diode string 75 comprising diodes PS1, PS2 couples input 72 with voltage rail 70, a third diode string 76 comprising diodes PD1 and PD2 couples input terminal 73 with voltage rail 71 and a fourth diode string 77 comprising two diodes PS1, PS2 couples input 73 with voltage rail 70. Through first to fourth diode strings 74 to 77 ESD protection for inputs 72, 73 is provided. It should be noted that in addition to first to fourth diode string 74 to 77 other conventional ESD protection elements may be present.

Each of first to fourth diode strings 74 to 77 may be implemented as embodiments as described above, for example as described with reference to FIGS. 1 and 3 to 6. In particular, while in FIG. 7 diode strings comprising two diodes as shown, diode strings comprising more diodes, for example four diodes as shown in FIGS. 5 and 6, may be also be used. Also some of first to fourth diode strings may be implemented as conventional diode strings.

Through the use of diode strings according to an embodiment, a leakage path 79 indicated by dotted lines caused by a conducting parasitic npn transistor 78 may be prevented, the leakage path causing a current flowing between input terminal 72 and 73.

In some embodiments, input terminal 73 may be a reset input terminal, and input terminal 73 may be a clock input terminal.

A further scenario where leakage may be prevented by embodiments is where supply voltages are turned off, and a circuit is supplied via an input/output terminal.

It should be noted that the environment of FIG. 7 is only one example where diode strings according to an embodiment may be used, and other scenarios are equally possible. For example, diode strings according to embodiments may generally be used for connecting input/output pins with supply voltages for ESD protection purposes.

What is claimed is:

1. A semiconductor structure, comprising:
a substrate,
a first well of a first polarity formed in said substrate,
a second well of a second polarity different from said first polarity formed within said first well,
a voltage terminal formed within the second well,
a third well of the second polarity formed within said first well,
a protected terminal formed within the third well,
a fourth well of the first polarity formed within said second well,
a fifth well of the second polarity formed within said third well, and
an electric coupling between said fourth well, said fifth well and said first well, wherein a parasitic transistor is formed by the fourth well, the second well and the first well, and the electric coupling biases the first well by said fourth well and said fifth well to prevent the parasitic transistor from conducting on failure of the supply voltage at the voltage terminal.

2. The structure of claim 1, wherein said electric coupling comprises a metal coupling or a polysilicon coupling.

3. The structure of claim 1, further comprising a sixth well formed within the third well, wherein said sixth well is coupled with an input/output terminal.

4. The structure of claim 1, further comprising a seventh well of said second polarity arranged within said second well, said seventh well having a higher dopant concentration than said second well, wherein said seventh well is coupled with a supply voltage.

5. The structure of claim 1, wherein said first polarity is an n-type polarity, and said second polarity is a p-type polarity.

6. The structure of claim 1, wherein said substrate is of the second polarity.

7. The structure of claim 1, wherein said electric coupling has a resistance smaller than 10Ω.

8. The structure of claim 1, further comprising:
an eighth well of the first polarity formed in said substrate,
a ninth well of said second polarity formed within said eighth well,
a tenth well of said second polarity formed within said eighth well,
an eleventh well of said first polarity formed within said ninth well,
a twelfth well of said first polarity formed within said tenth well,
a further electric coupling between said eleventh well, said tenth well and said eighth well,
wherein said ninth well is coupled with said third well.

9. The structure of claim 1, wherein said first well is formed as a single continuous semiconductor region of the first polarity.

10. The structure of claim 1, wherein said first well comprises a first well portion of the first polarity of the first well, said second well being arranged within said first well portion, and a second well portion of the first polarity of the first well, said third well being arranged within said second well portion, said first well portion and said second well portion being ohmically coupled with each other.

\* \* \* \* \*